United States Patent
Hong et al.

(10) Patent No.: US 6,867,109 B2
(45) Date of Patent: Mar. 15, 2005

(54) MASK SET FOR COMPENSATING A MISALIGNMENT BETWEEN PATTERNS AND METHOD OF COMPENSATING A MISALIGNMENT BETWEEN PATTERNS USING THE SAME

(75) Inventors: Soon Won Hong, Seoul (KR); Tae Hum Yang, Seoul (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 10/750,832

(22) Filed: Jan. 5, 2004

(65) Prior Publication Data

US 2004/0142253 A1 Jul. 22, 2004

Related U.S. Application Data

(62) Division of application No. 08/991,261, filed on Dec. 16, 1997, now Pat. No. 6,713,883.

(30) Foreign Application Priority Data

Dec. 16, 1996 (KR) .............................................. 96-66119

(51) Int. Cl.$^7$ ............................................ H01L 23/544
(52) U.S. Cl. ...................... 438/401; 257/797; 438/462; 438/975
(58) Field of Search .......................... 257/797; 438/401, 438/462, 975

(56) References Cited

U.S. PATENT DOCUMENTS

| | | | | |
|---|---|---|---|---|
| 3,808,527 A | * | 4/1974 | Thomas ...................... | 324/716 |
| 4,655,598 A | * | 4/1987 | Murakami et al. .......... | 356/400 |
| 4,929,083 A | | 5/1990 | Brunner | |
| 5,308,682 A | * | 5/1994 | Morikawa ................... | 428/195 |
| 5,672,520 A | * | 9/1997 | Natsume ..................... | 438/975 |
| 5,861,679 A | * | 1/1999 | Nagano ....................... | 257/786 |

\* cited by examiner

*Primary Examiner*—Allan R. Wilson
(74) *Attorney, Agent, or Firm*—Mayer, Brown, Rowe & Maw LLP

(57) ABSTRACT

The present invention discloses a mask set for compensating for a misalignment between the patterns and method of compensating for a misalignment between the patterns. A mask set of the present invention comprises a first mask consisted of a mask substrate on which a main pattern and a plurality of sub-patterns are formed, said sub-patterns formed at a side of the main pattern; a second mask consisted of a mask substrate on which a plurality of hole patterns are formed, the hole patterns corresponded to spaces between the main pattern and the sub-patterns of the first mask, respectively when the first and second mask are overlapped to each other; and a third mask consisted of mask substrate on which a plurality of bar patterns are formed, the bar patterns corresponded to the hole patterns of the second mask, respectively when the second and third mask are overlapped to each other.

7 Claims, 13 Drawing Sheets

MASK SET FOR COMPENSATING A MISALIGNMENT BETWEEN PATTERNS AND METHOD OF COMPENSATING A MISALIGNMENT BETWEEN PATTERNS USING THE SAME

This is a divisional application of prior application Ser. No. 08/991,261 filed on Dec. 16, 1997 now U.S. Pat. No. 6,713,883.

BACKGROUND OF THE INVENTION

1. Field of the Invention

The present invention relates to a mask set for compensating a misalignment between patterns and a method of compensating a misalignment between patterns using the same. In particular, the present invention relates to mask set for compensating for a misalignment between patterns and method of compensating for a misalignment between patterns using mask set.

2. Description of the Prior Art

Generally, in the process of manufacturing a semiconductor device, a mask process of ten through thirty steps is required in order to form an impurity diffusion region, a contact hole and a conductive pattern. As semiconductor devices become higher integrated, a process margin between the patterns becomes more narrow. In the lithography process of forming a contact hole or a conductive pattern during the process of manufacturing the semiconductor device, there occurs a misalignment between the underlying and the upper patterns due to a misalignment occurring when the mask and the wafer are loaded into the exposure equipment and an alignment error of the exposure equipment itself. Though it does not cause a problem when the process margin between the underlying pattern and the upper pattern is great, when a contact hole is formed between the underlying and the upper patterns when the process margin therebetween is small, these patterns are likely to be exposed or part of them are likely to be etched, thereby resulting in reduction of reliability of the semiconductor device.

In order to solve these problems, a conventional method is to insert an alignment mark into a mask and/or a wafer and then monitor the alignment mark at the exposure equipment so as to compensate for a misalignment of the mask and/or the wafer. Also an alignment error of the exposure equipment itself in the conventional method is obtained in such a manner that it selects the mask having smallest process margin between the patterns among the masks for use in the manufacture process of a semiconductor device, forms patterns on a test wafer through the lithography process using these masks, and measures the alignment accuracy by means of the optical methods such as SEM or TEM etc. However, the measured values by this method are different for each person since they are obtained by each person's baked eye and further the time taken to perform one-time measurement is too long, thus it is extremely difficult to obtain statistical data. Especially, it is usually difficult to use the test wafer once the alignment accuracy of which is measured for other purpose since the sample thereof must be cut away the wafer in order to take a photograph of the cross-sectional SEM.

SUMMARY OF THE INVENTION

It is an object of the present invention to method of compensating for a misalignment between patterns using three masks, which can measure electrically the alignment accuracy.

To achieve the above object, a mask set for compensating a misalignment between patterns comprises a first mask consisted of a mask substrate on which a main pattern and a plurality of sub-patterns are formed, a second mask consisted of a mask substrate on which a plurality of hole patterns are formed. The hole patterns of the second mask correspond to spaces between the main pattern and the sub-patterns of the first mask, respectively when the first and second mask are overlapped to each other.

The mask set further comprises a third mask consisted of mask substrate on which a plurality of bar patterns are formed, the bar patterns correspond to the hole patterns of the second mask, respectively when the second and third mask are overlapped to each other.

A method of compensating a misalignment between patterns, comprises the steps of forming a first test pattern and a plurality of second test patterns on a first insulating layer formed on a test wafer using a first mask; forming a second insulating layer on the first insulating layer including the first test pattern and the plurality of second test patterns and then forming contact holes between said the first test pattern and the plurality of second test patterns, respectively, using a second mask; forming third test patterns on the plurality of contact holes, respectively, using a third mask; measuring resistance using a resistance tester of which one terminal is connected to the first test pattern and another terminal is connected to the plurality of second test patterns one by one; and confirming a misalignment between the patterns using the measured resistance value.

BRIEF DESCRIPTION OF THE DRAWINGS

Other objects and advantages of the present invention will be understood by the detailed explanation of the embodiment with reference to the accompanying drawings in which.

DETAILED DESCRIPTION OF PREFERRED EMBODIMENT

Figure 1:
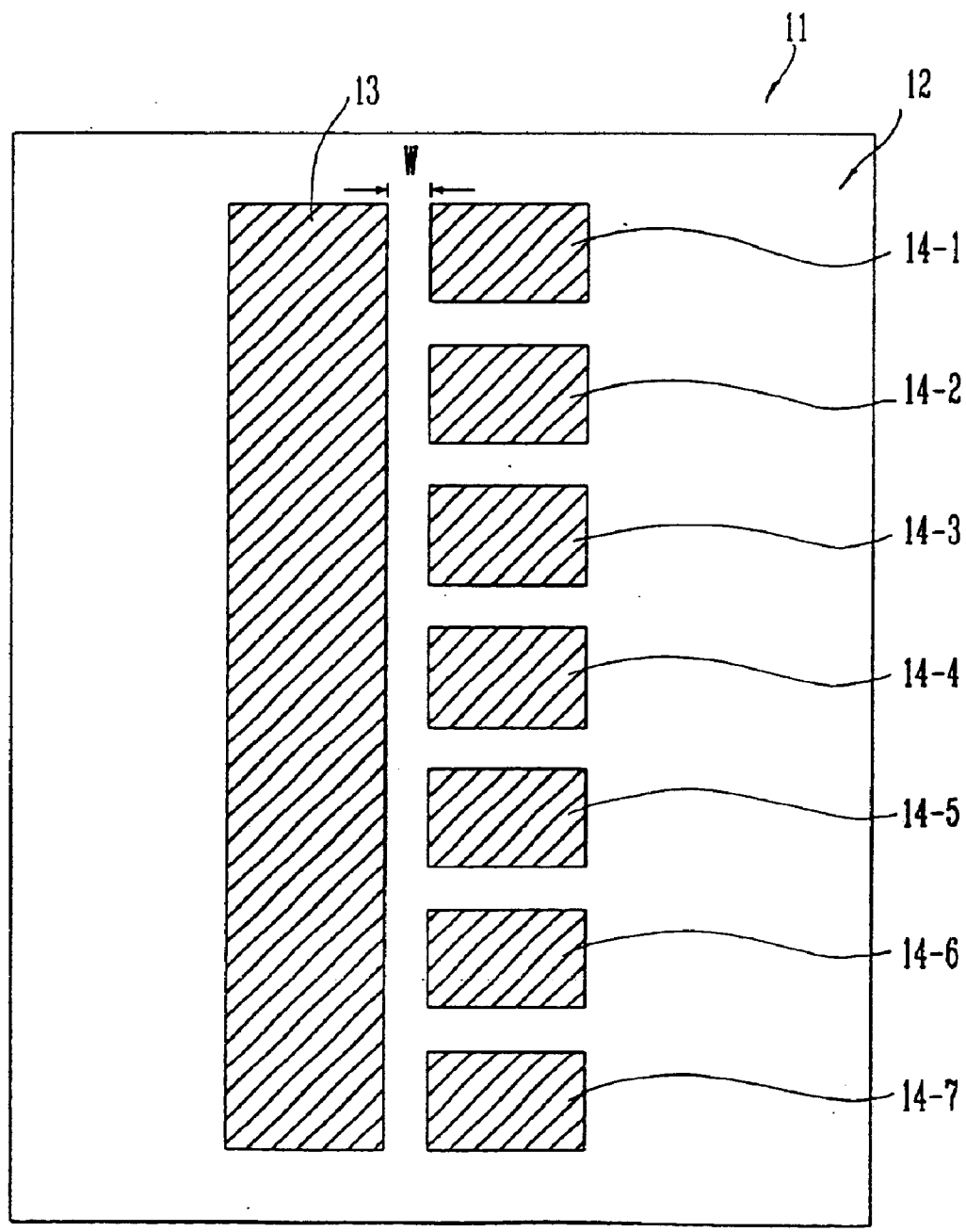
FIGS. 1, 2 and 3 are plan views of first, second and third masks according to a first embodiment of the present invention.
Figure 2:
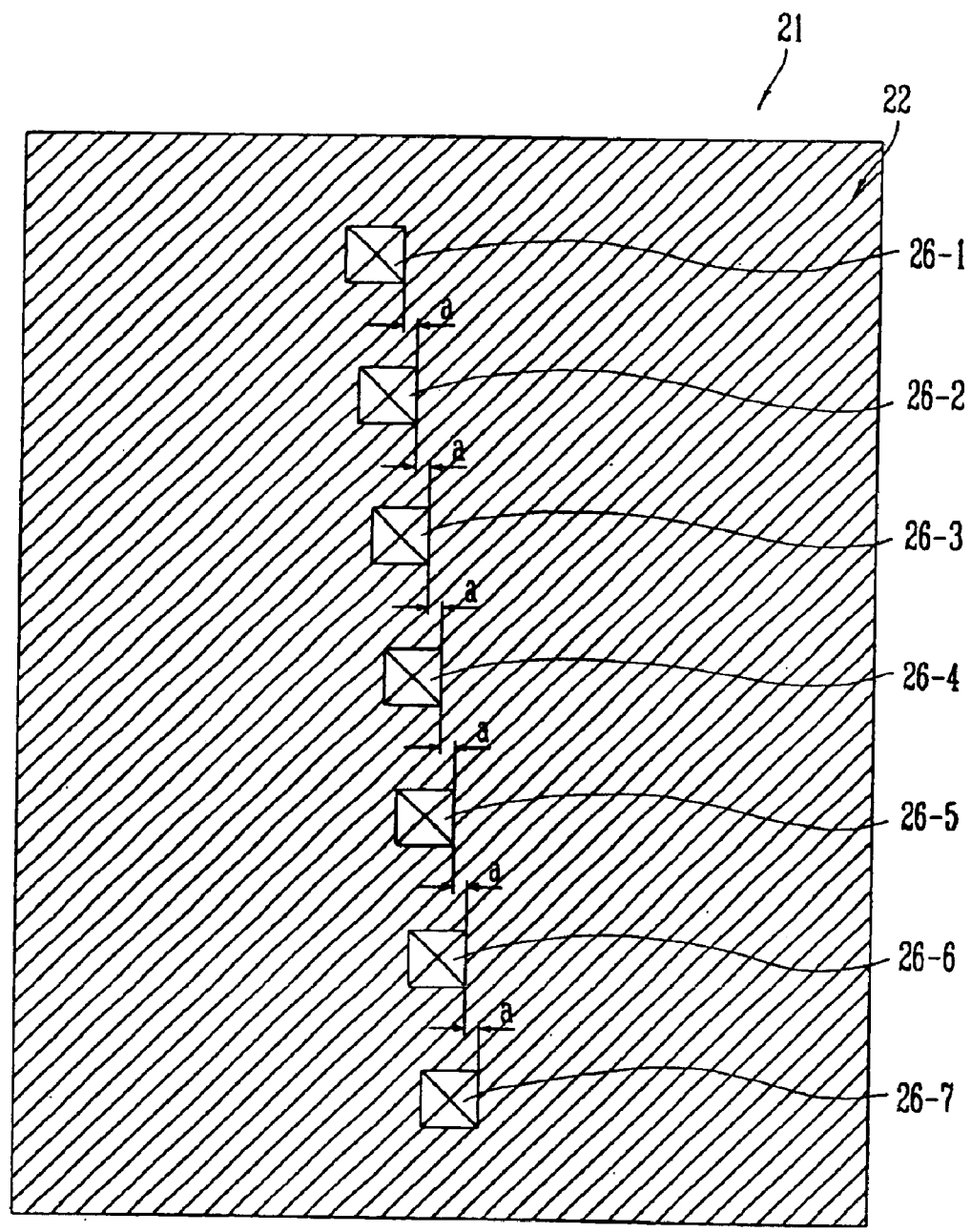
Figure 3:
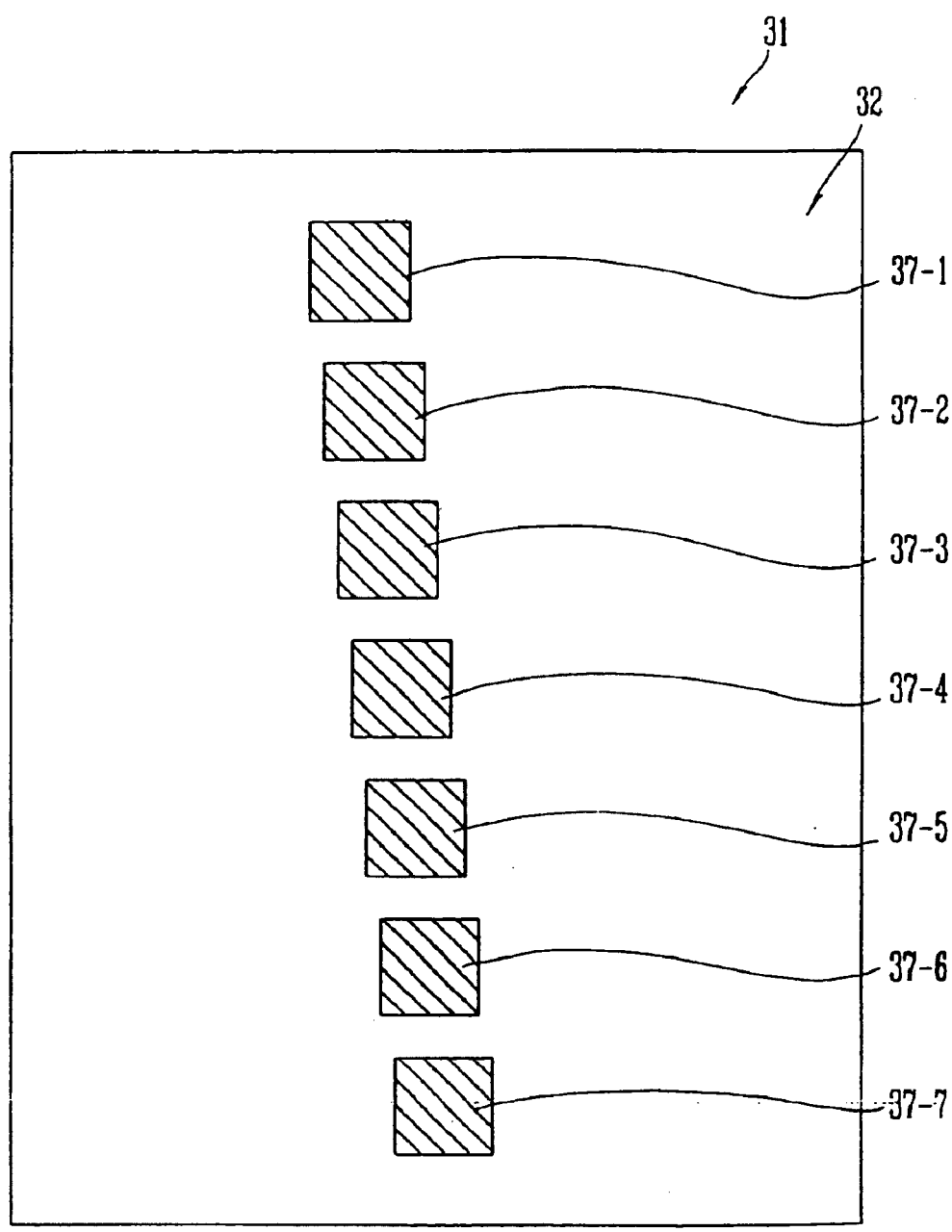

FIGS. 1, 2 and 3 are plan views of a first, second and third masks according to a first embodiment of the present invention.

In a first mask 11, a main pattern 13 is formed at a selected position on a mask substrate 12 and a first to the seventh sub-patterns 14-1 to 14-7 are formed at one side of the main pattern 13. Each of the first to seventh sub-patterns 14-1 to 14-7 is formed at a location spaced apart by "W" from the main pattern 13.

Here, the mask substrate 12 of the first mask 11 is made of transparent materials such as quartz, and the main pattern 13 and the first to seventh sub-patterns 14-1 to 14-7 are made of light-shielding materials such as chrome.

In a second mask 21, a first to seventh hole patterns 26-1 to 26-7 are formed on a mask substrate 22. The first to seventh hole patterns 26-1 to 26-7 are formed with equal size from each other. When the first mask 11 and the second mask 21 are overlapped with each other, the first to seventh hole patterns 26-1 to 26-7 are positioned at spaces between the main pattern 13 and the first to seventh sub-patterns 14-1 to 14-7, respectively. The fourth hole pattern 26-4 located at center of the first to seventh hole patterns 26-1 to 26-7 is exactly positioned at the center of a space between the main pattern 13 and the fourth sub-pattern 14-4. The third, second and first hole patterns 26-3, 26-2 and 26-1 are formed at positions consecutively shifted toward the main pattern 13 by a fixed distance "a"; and the fifth, sixth and seventh hole patterns 26-5, 26-6 and 26-7 are formed at positions consecutively shifted toward the fifth, the sixth and the seventh sub-patterns 14-5, 14-6 and 14-7 by a fixed distance "a".

Here, the mask substrate 22 of the second mask 20 is made of transparent materials such as quartz, and the first to the seventh hole patterns 26-1 to 26-7 are formed by removing chrome of light-shielding materials from the mask substrate 22. As the location variation "a" between adjacent hole patterns, for example, between first and second hole patterns 26-1 and 26-7 is small, a smaller size of error measurement is made possible. In the preferred embodiment of the present invention, the distance "a" is set in the range of 0.01 through 0.1 $\mu$m.

In a third mask 30, a first to seventh bar patterns 37-1 to 37-7 are formed on a mask substrate 32. When the second mask 21 and the third mask 31 are overlapped with each other, the first to the seventh bar patterns 37-1 to 37-7 are overlapped to the first to the seventh hole patterns 26-1 to 26-7 of the second mask 20, respectively.

Here, the mask substrate 32 of the third mask 31 is made of transparent materials such as quartz, and the first to the seventh bar patterns 37-1 to 37-7 are made of light-shielding materials such as chrome.

In the above, the distance "W" between the main pattern 13 and the sub-patterns 14-1 to 14-7 of the first mask 10 is determined by the size of the hole patterns. Though the distance "W" may be made to be equal to or a little greater or a little smaller than the size of the each hole pattern, the case in which the distance "W" is made to be smaller than the size of the hole patterns will be explained in the first embodiment of the present invention. Even though the distance "W" is made to be equal to or a little greater than the size of the hole patterns, a same result of the measurement can be obtained compared to the case in which the distance is made to be smaller than the size of the hole patterns, but the method of analyzing and processing the results of the measurement may be a little different.

Figure 4:
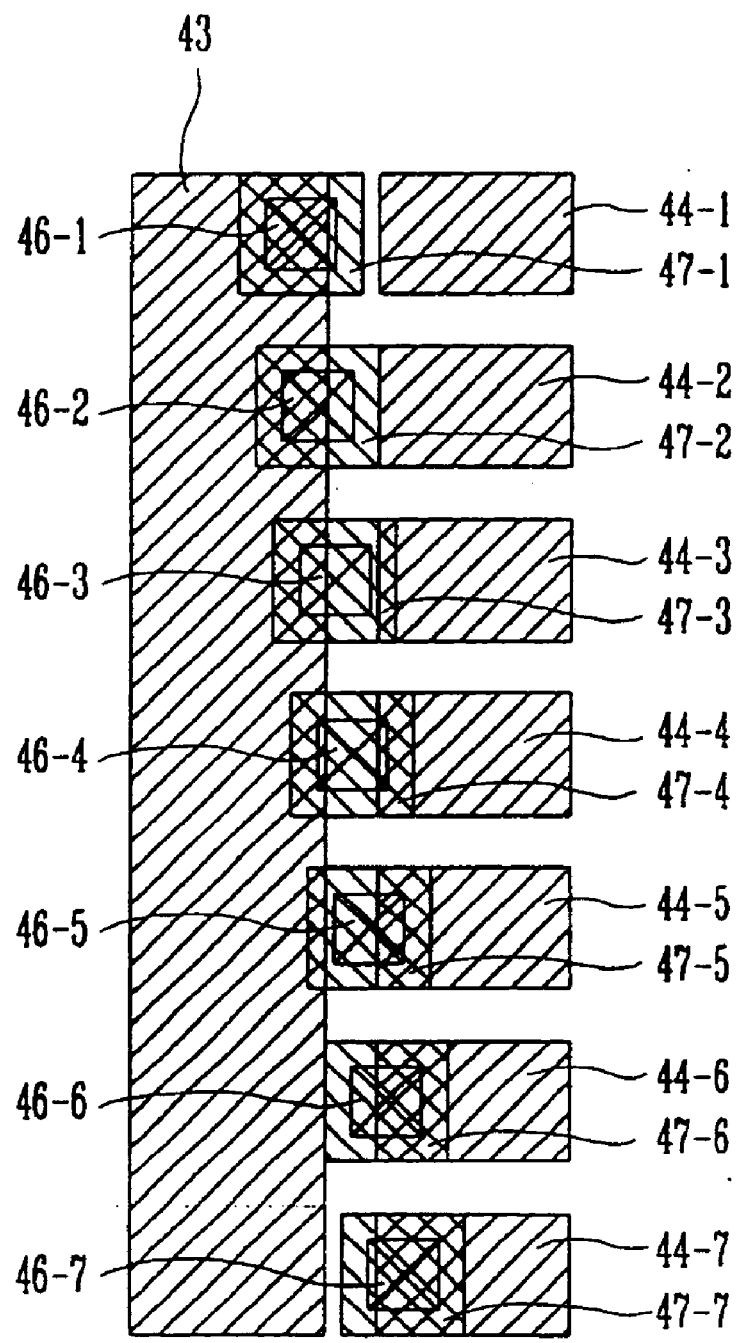
FIG. 4 is a layout of a test wafer in which an alignment error between patterns is not occurred during the photolithography process using the first, second and third masks of the present invention.
Figure 5A:
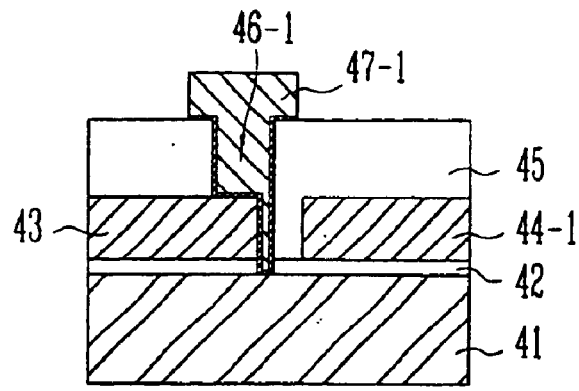
FIGS. 5A to 5G are sectional views for showing sections of contact holes shown in FIG. 4.
Figure 5B:
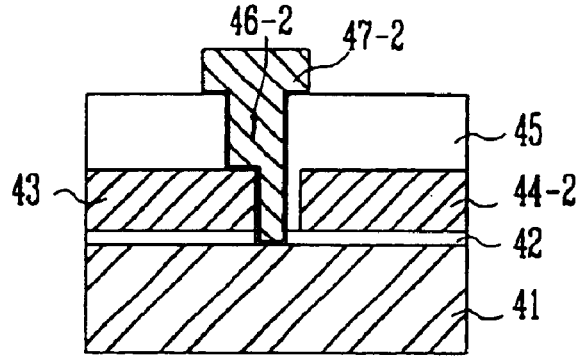
Figure 5C:
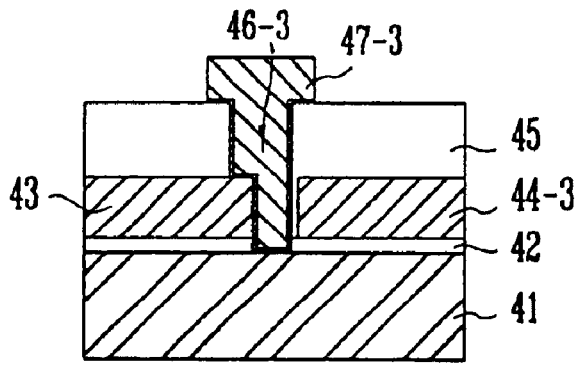
Figure 5D:
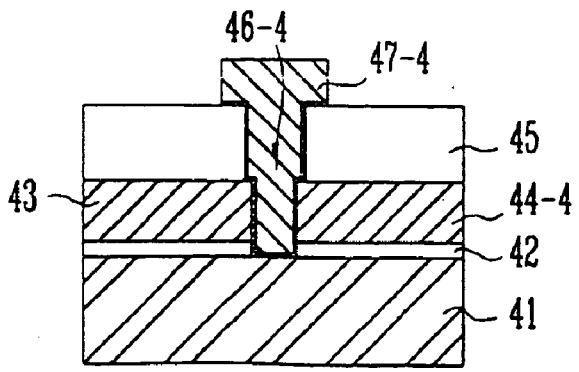
Figure 5E:
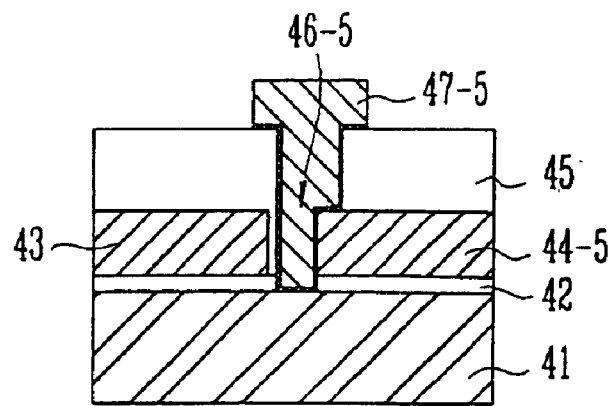
Figure 5F:
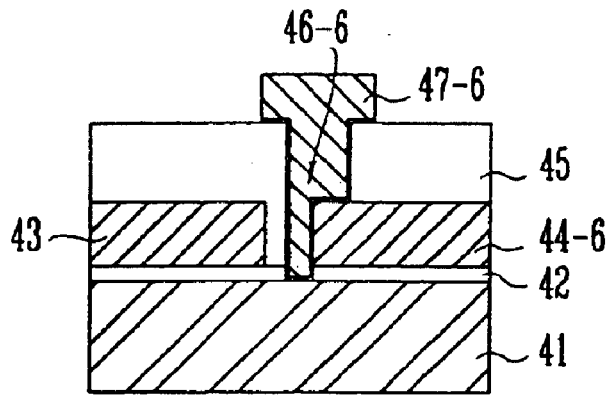
Figure 5G:
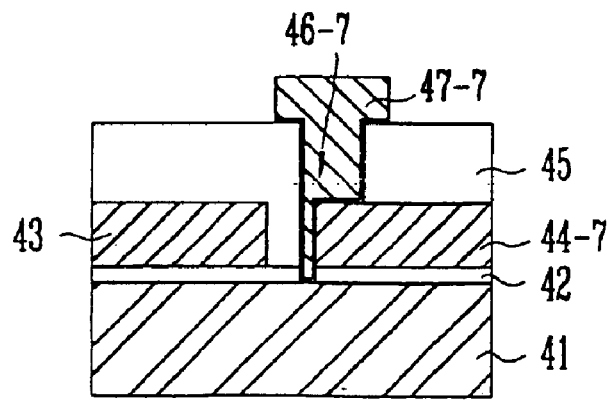

FIG. 4 is a layout of the test wafer in which a misalignment between the patterns dose not occurred during the photolithography process using the first, second and third masks 11, 21 and 31 of the present invention, and FIGS. 5A to 5G are sectional views of contact holes 46-1 to 46-7 shown in FIG. 4.

First, a first insulating layer 42 is formed on a test wafer 41. After a first conductor is deposited on the first insulating layer 42, a selected portion of the first conductor is removed by the photolithography process using the first mask 11, thereby forming a first test pattern 43 and second-first to second-seventh test patterns 44-1 to 44-7 on the first insulating layer 42. The first test pattern 43 corresponds to the main pattern 13 of the first mask 11, and the second-first to the second-seventh test patterns 44-1 to 44-7 correspond to the first to the seventh sub-patterns 14-1 to 14-7 of the first mask 11, respectively. The first conductor is made of at least one of polysilicon, amorphous silicon, a single crystal silicon and a conductive metal.

After a second insulating layer 45 is formed on the first insulating layer 42 including the first test pattern 43 and the second-first to second-seventh test patterns 44-1 to 44-7, the second insulating layer 45 and the first insulating layer 42 are sequentially removed by the photolithography process using the second mask 21, thereby forming a first to seventh contact holes 46-1 to 46-7 between the first test patterns 43 and the second-first to second-seventh test patterns 44-1 to 44-7, respectively. The first to the seventh contact holes 46-1 to 46-7 correspond to the first to the seventh hole patterns 26-1 to 26-7 of the second mask 21, respectively.

Then, after a second conductor is deposited on the second insulating layer 45 including the first to the seventh contact holes 46-1 to 46-7, a selected portion of the second conductor is removed by the photolithography process using the third mask 31, thereby forming a third-first to third-seventh test patterns 47-1 to 47-7 on the first to the seventh contact holes 46-1 to 46-7, respectively. The third-first to the third-seventh test patterns 47-1 to 47-7 correspond to the first to the seventh bar patterns 37-1 to 37-7 of the third mask 31, respectively. The second conductor is made of a barrier metal and a conductive metal, or is made of at least one of polysilicon, amorphous silicon, and a single crystal silicon.

When the first, the second and the third masks 11, 21 and 31 are overlapped with another, the fourth hole pattern 26-4 in the middle of the first to the seventh hole patterns 26-1 to 26-7 is exactly positioned at the center of a space between the main pattern 13 and the fourth sub-pattern 14-4. The fourth contact hole 46-4 in the center of the first to the seventh contact holes 46-1 to 46-7 is exactly positioned at the center of a space between the first test pattern 43 and the second-fourth contact hole 46-4, as shown in FIG. 4. This means that a misalignment between the patterns did not occur in the photolithography process.

For convenience of explanation, though the second-first to the second-seventh contact holes 46-1 to 46-7 are transversely cut in order to confirm an alignment state between the patterns using the section, the misalignment error is actually confirmed by an electrical measuring method.

When a terminal of the resistance tester is connected to the first test pattern 43 and then another terminal is connected to the second-first to the second-seventh test patterns 44-1 to 44-7 one by one, a resistance between the first test pattern 43 and the second-fourth test pattern 44-4 is low, resistances between the first test pattern 43 and the second-first, the second-second, the second-third, the second-fifth, the second-sixth and the second-seventh test patterns 44-1, 44-2, 44-3, 44-5, 44-6 and 44-7 are high, respectively. This result of the measurement means that a misalignment between the patterns did not occur.

Now, the case in which a misalignment between the patterns occurs will be explained by reference to FIG. 6 and FIGS. 7A to 7G.

Figure 6:
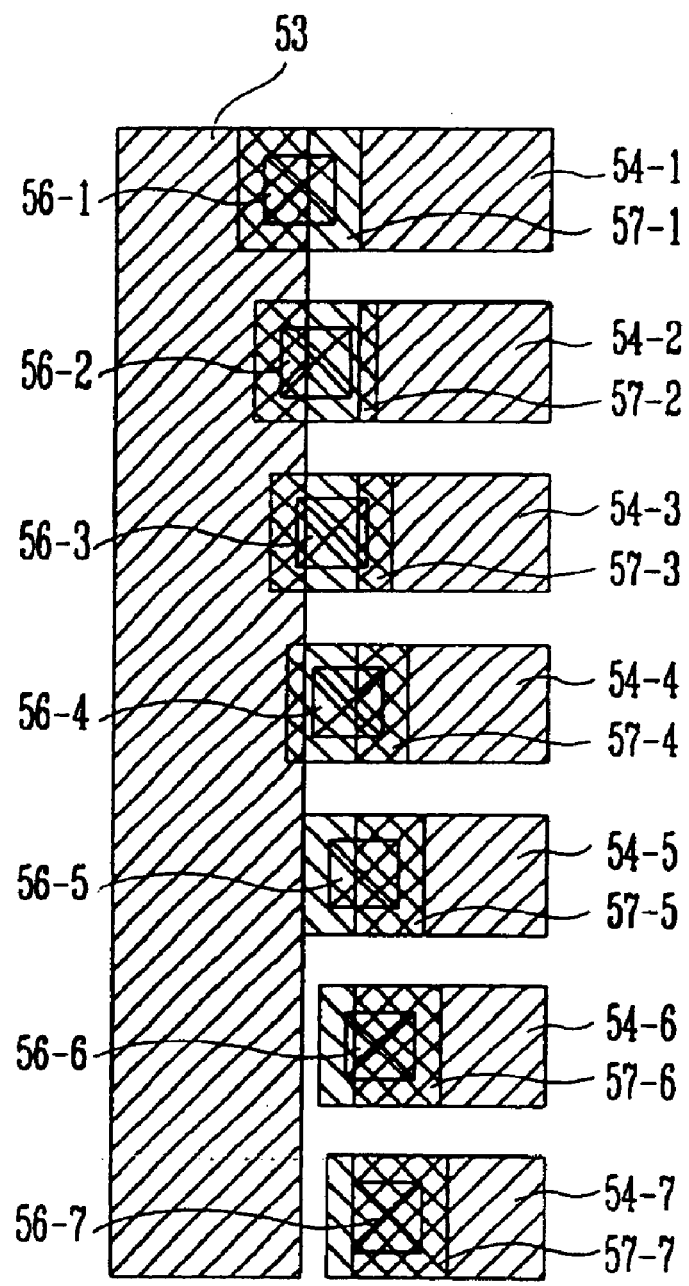
FIG. 6 is a layout of the test wafer in which an alignment error between patterns occurs during the photolithography process using the first, second and third masks of the present invention.
Figure 7A:
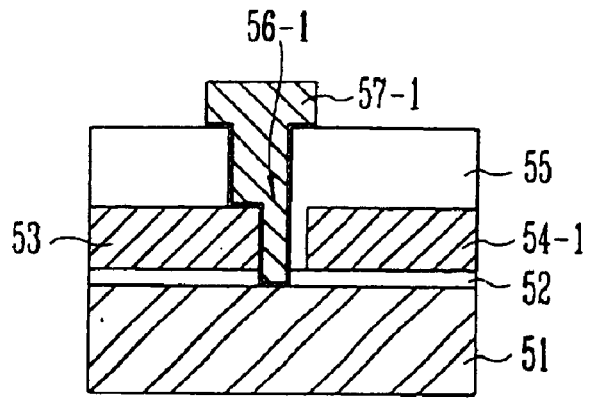
FIGS. 7A to 7G are sectional views for showing sections of contact holes shown in FIG. 6.
Figure 7B:
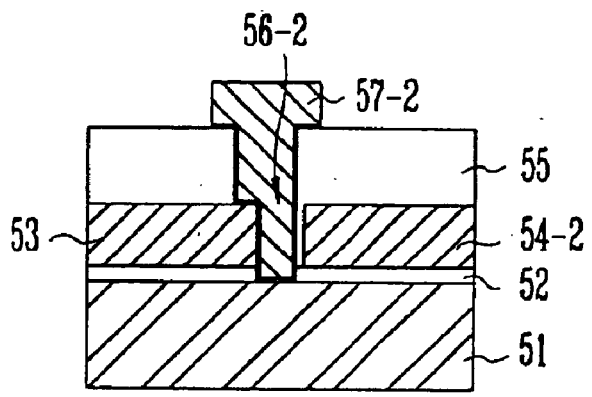
Figure 7C:
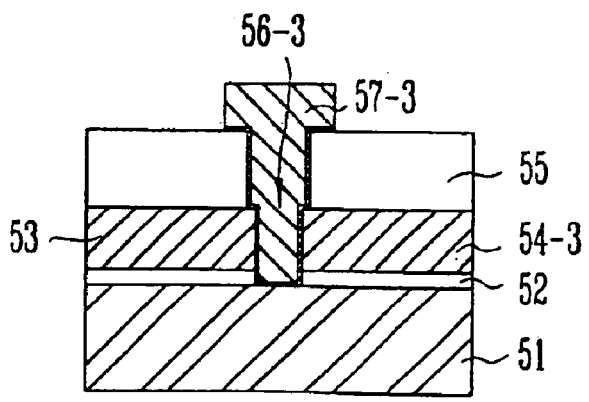
Figure 7D:
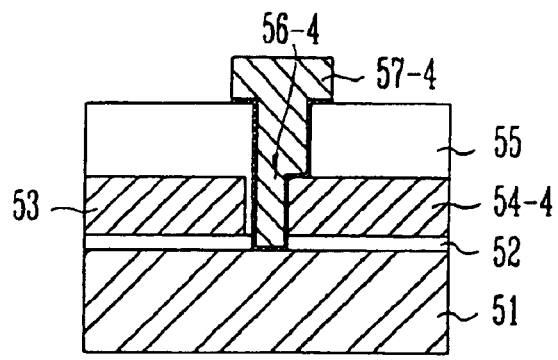
Figure 7E:
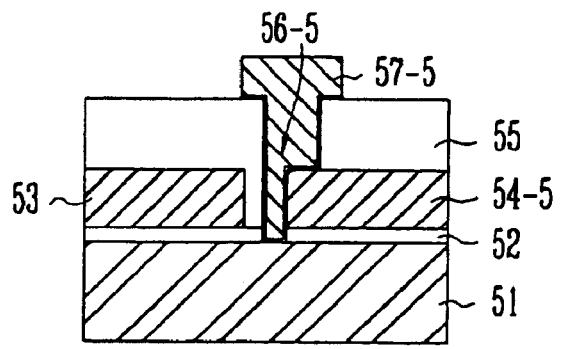
Figure 7F:
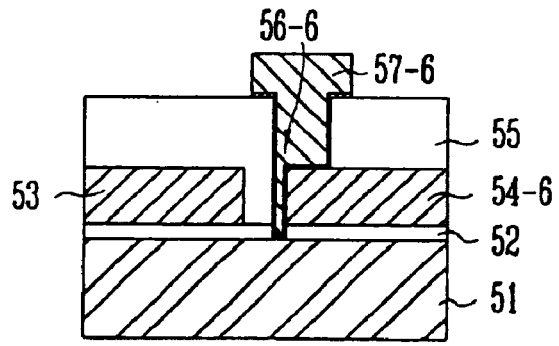
Figure 7G:
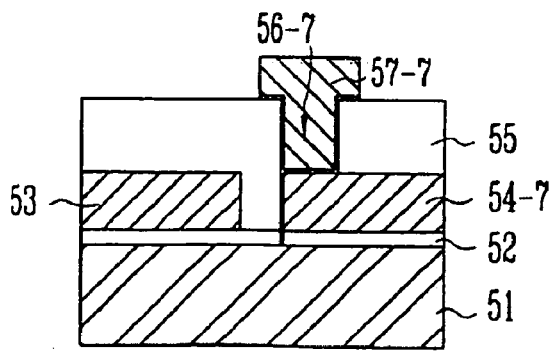

FIG. 6 is a layout of the test wafer in which a misalignment between the patterns occurs during the photolithography process using the first, second and third masks 11, 21 and 31 of the present invention, and FIGS. 7A to 7G are sectional views of contact hole 56-1 to 56-7 formed on the test wafer.

A first insulating layer 52 is formed on a test wafer 51. After a first conductor is deposited on the first insulating layer 52, a portion of the first conductor is removed by the photolithography process using the first mask 11, thereby forming a first test pattern 53 and second-first to second-seventh test patterns 54-1 to 54-7 on the first insulating layer 52. The first test pattern 53 corresponds to the main pattern 13 of the first mask 11, the second-first to the second-seventh test patterns 54-1 to 54-7 correspond to the first to the seventh sub-patterns 14-1 to 14-7 of the first mask 11, respectively. The first conductor is made of at least one of polysilicon, amorphous silicon, a single crystal silicon and a conductive metal.

After a second insulating layer 55 is formed on the first insulating layer 52 including the first test pattern 53 and the second-first to second-seventh test patterns 54-1 to 54-7, the second insulating layer 55 and the first insulating layer 52 are sequentially removed by the photolithography process using the second mask 21, thereby forming the first to the seventh contact holes 56-1 to 56-7 between the first test patterns 53 and the second-first to second-seventh test patterns 54-1 to 54-7, respectively. The first to the seventh contact holes 56-1 to 56-7 correspond to the first to the seventh hole patterns 26-1 to 26-7 of the second mask 21, respectively. Then, after a second conductor is deposited on the second insulating layer 55 including the first to the seventh contact holes 56-1 to 56-7, a selected portion of the second conductor is removed by the photolithography process using the third mask 31, thereby forming a third-first to third-seventh test patterns 57-1 to 57-7 on the first to the seventh contact holes 56-1 to 56-7, respectively. The third-first to the third-seventh test patterns 57-1 to 57-7 correspond to the first to the seventh bar patterns 37-1 to 37-7 of the third mask 31, respectively. The second conductor is made of a barrier metal and a conductive metal, or is made of at least one of polysilicon, amorphous silicon, and a single crystal silicon.

When the first, the second and the third masks 11, 21 and 31 are overlapped with another, it is desirable that the fourth hole pattern 26-4 located at center of the first to the seventh hole patterns 26-1 to 26-7 is exactly positioned at the center of a space between the main pattern 13 and the fourth sub-pattern 14-4. However, the fourth contact hole 56-4 is slightly shifted to right direction from a center between the first pattern 53 and the second-fourth contact hole 56-4, the third contact hole 56-3 is exactly positioned at the center of a space between the first 53 and the second-third contact hole 26-3, as shown in FIG. 6. This means that a misalignment between the patterns occurs by a distance "a" in the photolithography process.

For convenience of explanation, although the second-first to the second-seventh contact holes 56-1 to 56-7 are transversely cut in order to confirm a misalignment state between the patterns, the misalignment is actually confirmed by an electrical measuring method.

When a terminal of the resistance tester is connected to the first test pattern 53 and then another terminal is connected to the second-first to the second-seventh test patterns 54-1 to 54-7 one by one, a resistance between the first test pattern 53 and the second-third test pattern 54-4 is low, resistances between the first test pattern 53 and the second-first, the second-second, the second-fourth, the second-fifth, the second-sixth and the second-seventh test patterns 54-1, 54-2, 54-4, 54-5, 54-6 and 54-7 are high, respectively. This result of the measurement means that a misalignment between the patterns did occur right by a distance "a".

Assuming that a misalignment of the exposure equipment itself is 0.025 $\mu$m and the value of the distance "a" is set to be 0.05 $\mu$m, from the result of the above measurement, it can be seen that a misalignment of a minimum of 0.025 $\mu$m to a maximum of 0.075 $\mu$m in the first mask 21 has occurred right with respect to the first mask 11. If the misalignment is compensated for by this result of the measurement so that the hole patterns 26-1 to 26-7 of the second mask 21 are consecutively shifted left at a distance of 0.025 $\mu$m, the range of the misalignment becomes a minimum of 0.025 $\mu$m to a maximum of 0.05 $\mu$m, therefore, it is possible to measure accurately. As a result, using this method, a misalignment can be measured at least with accuracy of the amount of the unit shift "a" of the hole pattern.

Figure 8:
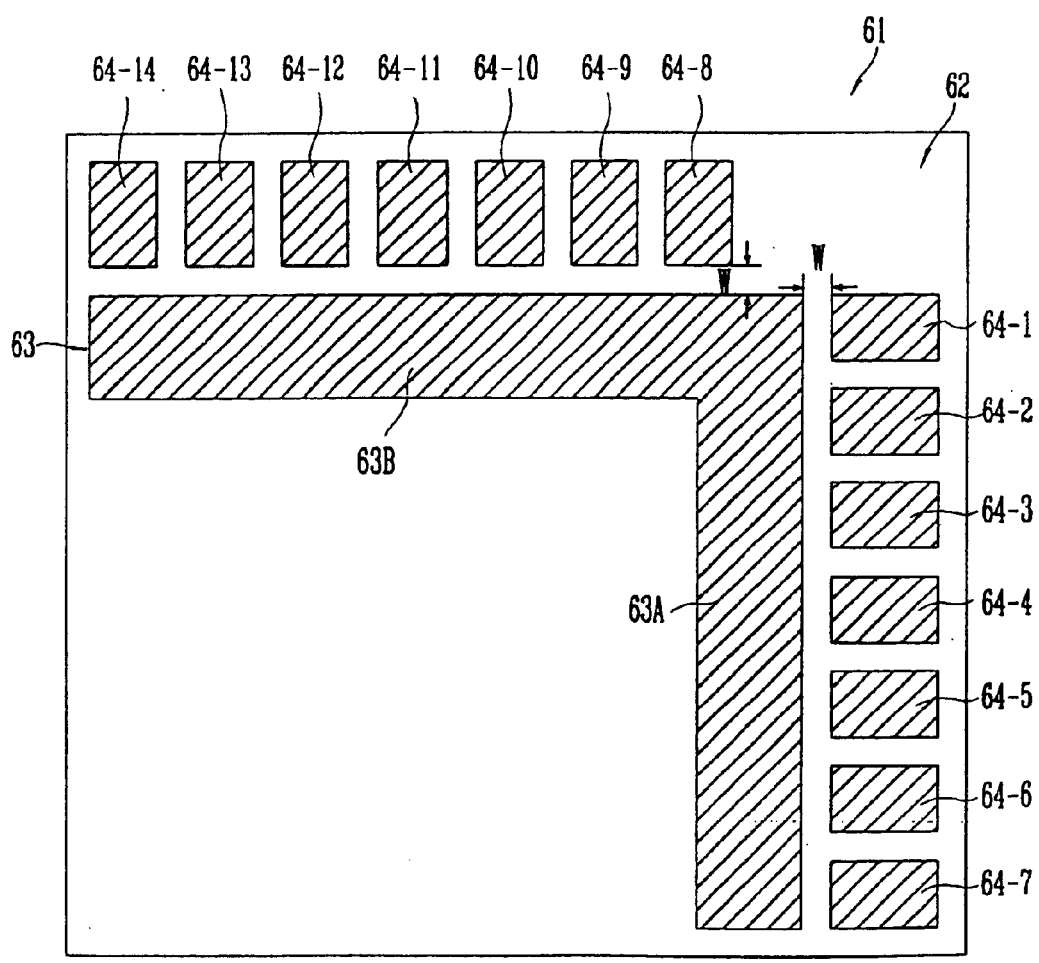
FIGS. 8, 9 and 10 are plan views of first, second and third masks according to a second embodiment of the present invention.
Figure 9:
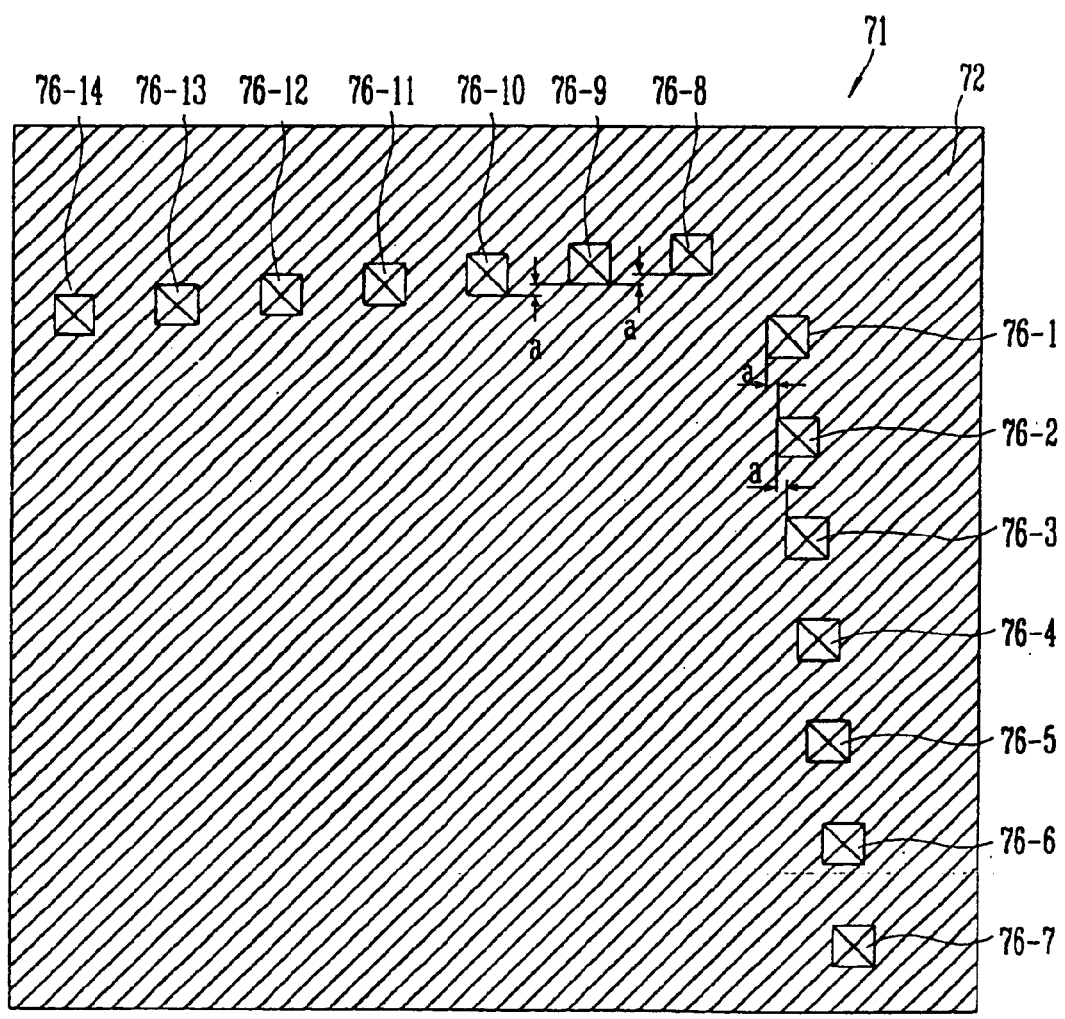
Figure 10:
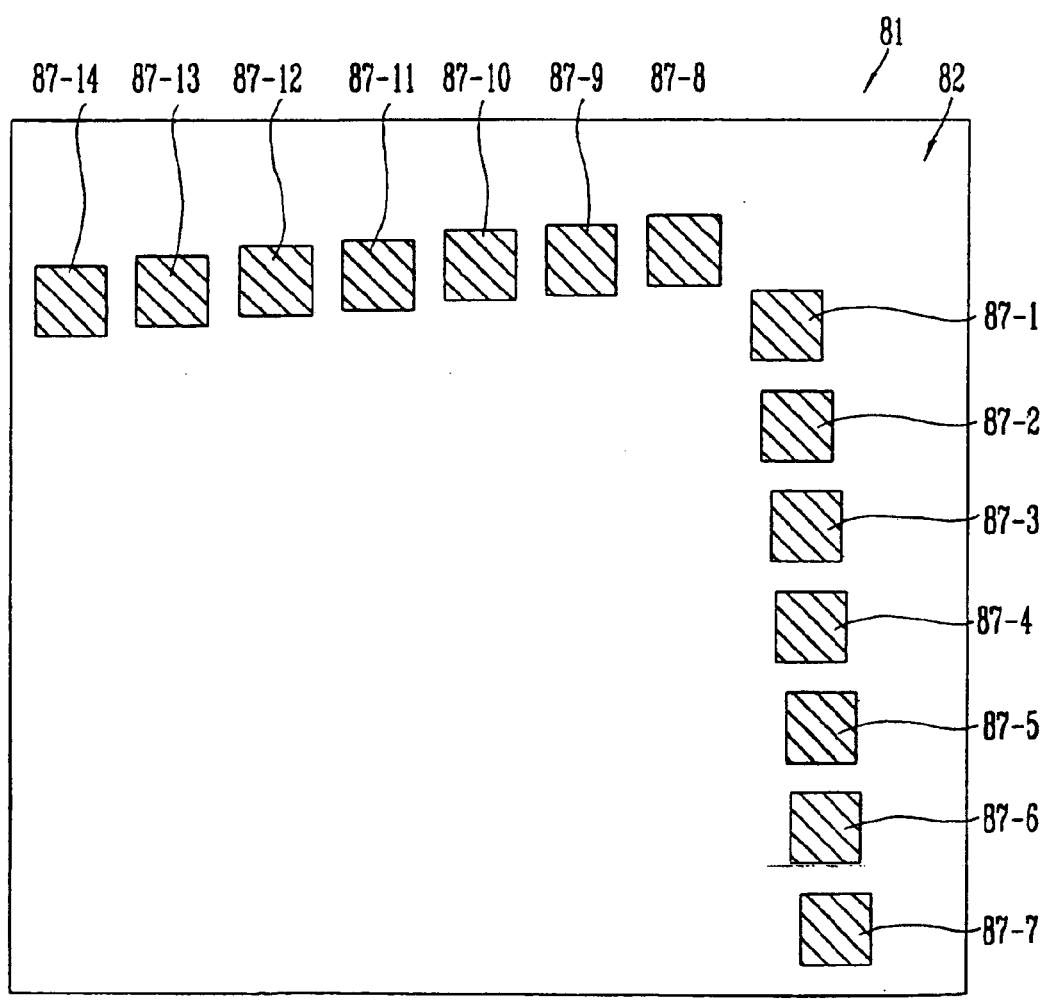
Figure 11:
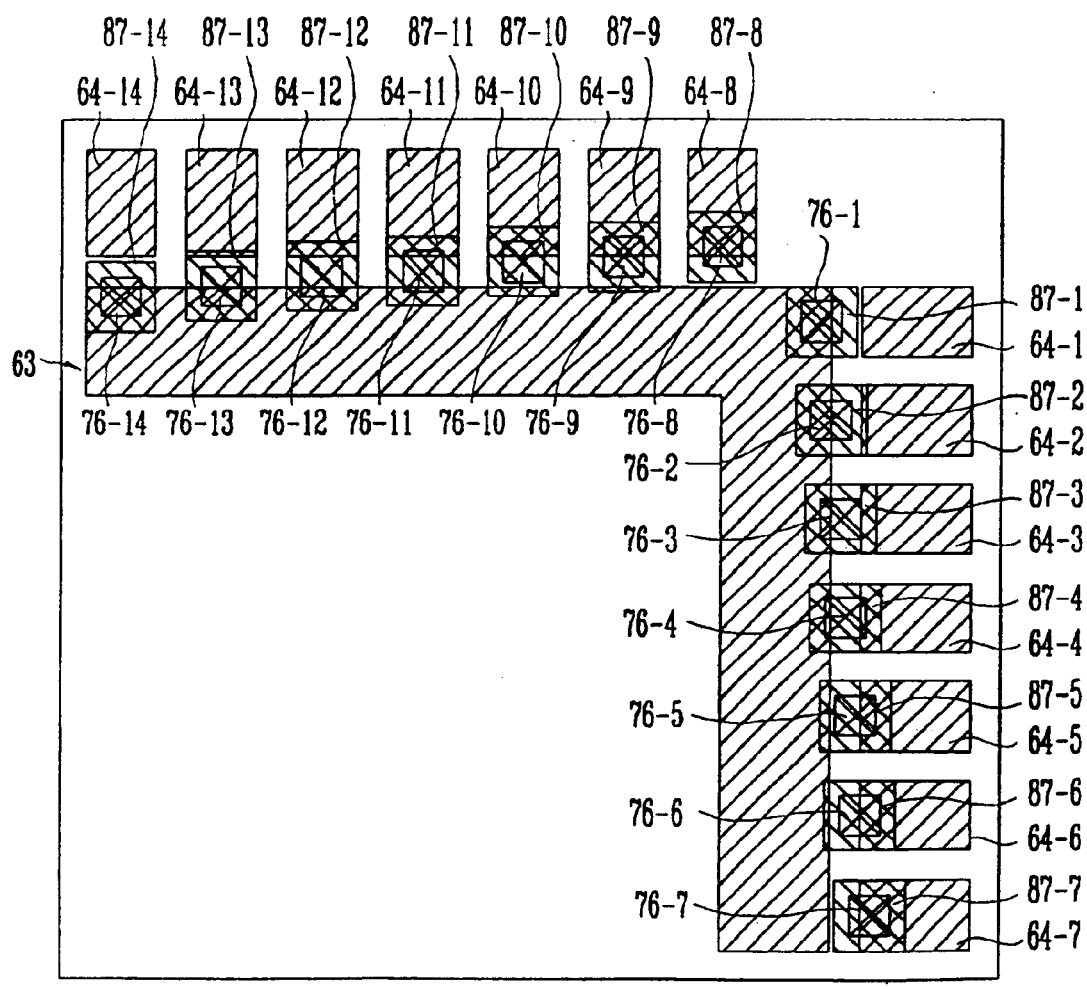
FIG. 11 illustrates the overlapped view of the first, second and third masks according to the second embodiment of the present invention.

FIGS. 8, 9 and 10 are plan views of first, second and third masks according to the second embodiment of the present invention, and FIG. 11 illustrates the overlapped view of the first, second and third masks.

In a first mask 61, a main pattern 63 is formed at a selected position on a mask substrate 62. The main pattern 63 is divided into a first main pattern 63A and a second main pattern 63B at right angle each other. A first to the seventh sub-patterns 64-1 to 64-7 are formed longitudinally at one side of the first main pattern 63A. A certain space "W" maintains between the each sub-pattern 64-1 to 64-14 and the first main pattern 63A. Also, a eighth to the fourteenth sub-patterns 64-8 to 64-14 are formed longitudinally at one side of the second main pattern 63B. A certain space "W" maintains between the each sub-pattern 64-8 to 64-14 and the second main pattern 63B.

Here, the mask substrate 62 of the first mask 61 is made of transparent materials such as quartz, and the main pattern 63 and the first to the fourteenth sub-patterns 64-1 to 64-14 are made of light-shielding materials such as chrome.

In a second mask 71, a first to fourteenth hole patterns 76-1 to 76-14 are formed to be equal in size on a mask substrate 72. When the first mask 61 and the second mask 71 are overlapped with each other, the first to the fourteenth hole patterns 76-1 to 76-14 correspond spaces between the main pattern 63 and the first to the fourteenth sub-patterns 64-1 to 64-14, respectively. The fourth hole pattern 76-4 located at center of the first to the seventh hole patterns 76-1 to 76-7 is exactly positioned at the center of a space between the main pattern 63 and the fourth sub-pattern 64-4. The third, the second and the first hole patterns 76-3, 76-2 and 76-1 formed along one side of the fourth hole pattern 76-4 are consecutively shifted toward the main pattern 63 by a fixed distance "a"; and the fifth, the sixth and the seventh hole patterns 76-5, 76-6 and 76-7 formed along another side of the fourth hole pattern 76-4 are consecutively shifted toward the fifth, the sixth and the seventh sub-patterns 64-5, 64-6 and 64-7 by a fixed distance "a". Also, the eleventh hole pattern 76-11 located at center of the eighth to the fourteenth hole patterns 76-8 to 76-14 is exactly positioned at the center of a space between the main pattern 63 and the eleventh sub-pattern 64-11. The tenth, the ninth and the eighth hole patterns 76-10, 76-9 and 76-8 formed along one side of the eleventh hole pattern 76-11 are consecutively shifted toward the main pattern 63 by a fixed distance "a"; and the twelfth, the thirteenth and the fourteenth hole patterns 76-12, 76-13 and 76-14 formed along another side of the fourth hole pattern 76-11 are consecutively shifted toward the twelfth, the thirteenth and the fourteenth sub-patterns 64-12, 64-13 and 64-14 by a fixed distance "a".

Here, the mask substrate 72 of the second mask 71 is made of transparent materials such as quartz, and the first to the fourteenth hole patterns 76-1 to 76-14 are made by removing chrome of light-shielding materials on the mask substrate 72. As the location variation between the adjacent hole patterns (for example, between 76-1 and 76-2), that is the distance "a" is small, a measurement of smaller misalignment can be possible.

In a third mask 81, a first to fourteenth bar patterns 87-1 to 87-14 are formed on a mask substrate 82. When the fifth mask 71 and the sixth mask 81 are overlapped with each other, the first to the fourteenth bar patterns 87-1 to 87-14 correspond to the first to the fourteenth hole patterns 76-1 to 76-14, respectively.

Here, the mask substrate 82 of the third mask 81 is made of transparent materials such as quartz, and the first to the fourteenth bar patterns 87-1 to 87-14 are made of light-shielding materials such as chrome.

In the above, the distance "W" between the main pattern 63A or 63B and the sub-patterns 64-1 to 64-7 or 64-8 to 64-14 of the first mask 61 is determined by the size of the hole patterns. Though the distance "W" may be made to be equal to or a little greater or a little smaller than the size of the hole patterns, the case in which the distance "W" is made to be smaller than the size of the hole patterns was explained in the second embodiment of the present invention.

Though the first, second and third masks according to the second embodiment are quite different in structure compared to the first, the second and the third masks according the first embodiment, the principle of measuring method and compensating for the misalignment between the patterns are equal to each other, therefore the detailed explanation thereof will be omitted.

While a misalignment either in the X-axis direction or in the Y-axis direction can be measured in the first embodiment, a misalignment in both directions of X-axis and Y-axis can be measured at a time by the second embodiment.

As described above, according to the first and second embodiments of the present invention, as the misalignment between the patterns can be measured using the resistance tester, the time for measuring can be minimized and automation is possible. Therefore, it possible to measure a misalignment between the patterns at a large quantity of the test wafers and also to control a process by means of a statistical process. Also, the present invention can save a loss cost because it use an undestructive test without damaging the test wafer. Additionally, the method according to the present invention has a high quality of the measurement since it can always obtain a same value, different from the another optical measuring method by which the measuring values are different depending on an each person.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of compensating a misalignment between patterns, comprising the steps of:

forming a first test pattern and a plurality of second test patterns on a first insulating layer formed on a test wafer using a first mask;

forming a second insulating layer on said first insulating layer including said first test pattern and said plurality of second test patterns and then forming contact holes between said first test pattern and said plurality of second test patterns, respectively, using a second mask;

forming third test patterns on said plurality of contact holes, respectively, using a third mask;

measuring resistance using a resistance tester of which one terminal is connected to said first test pattern and another terminal is connected to said plurality of second test patterns one by one; and confirming a misalignment between the patterns using the measured resistance value.

2. The method of claim 1, wherein said first mask is consisted of a mask substrate on which a main pattern and a plurality of sub-patterns are formed, and said sub-patterns are formed at a side of said main pattern.

3. The method of claim 1, wherein said second mask is consisted of a mask substrate on which a plurality of hole patterns are formed, and said hole patterns correspond to spaces between said main pattern and said sub-patterns of said first mask, respectively when said first and second mask are overlapped to each other.

4. The method of claim 1, wherein said third mask is consisted of mask substrate on which a plurality of bar patterns are formed, said bar patterns are correspond to said hole patterns of said second mask, respectively when said second and third mask are overlapped to each other.

5. The method of claim 2, wherein said plurality of sub-patterns are formed at a predetermined distance with said main pattern.

6. The method of claim 2, wherein said plurality of sub-patterns of said second mask are formed at positions consecutively shifted to both direction by a certain distance basis on the central sub-pattern.

7. The mask set of claim 2, wherein said main pattern of said first mask is divided into a first main pattern and a second main pattern at right angle each other.

* * * * *